United States Patent
Eummelen et al.

(10) Patent No.: US 11,372,336 B2
(45) Date of Patent: Jun. 28, 2022

(54) LITHOGRAPHY APPARATUS AND DEVICE MANUFACTURING METHOD

(71) Applicant: ASML NETHERLANDS B.V., Veldhoven (NL)

(72) Inventors: Erik Henricus Egidius Catharina Eummelen, Veldhoven (NL); Frank Debougnoux, Voeren (BE); Koen Cuypers, Lommel (BE); Han Henricus Aldegonda Lempens, Weert (NL); Theodorus Wilhelmus Polet, Geldrop (NL); Jorge Alberto Vieyra Salas, Eindhoven (NL); John Maria Bombeeck, Eindhoven (NL); Johannes Cornelis Paulus Melman, Oisterwijk (NL); Giovanni Luca Gattobigio, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 152 days.

(21) Appl. No.: 16/464,361

(22) PCT Filed: Nov. 1, 2017

(86) PCT No.: PCT/EP2017/077950
§ 371 (c)(1),
(2) Date: May 28, 2019

(87) PCT Pub. No.: WO2018/108380
PCT Pub. Date: Jun. 21, 2018

(65) Prior Publication Data
US 2021/0096471 A1    Apr. 1, 2021

(30) Foreign Application Priority Data

Dec. 14, 2016  (EP) ..................................... 16203967
Mar. 27, 2017  (EP) ..................................... 17163003

(51) Int. Cl.
*G03F 7/20* (2006.01)

(52) U.S. Cl.
CPC ...... *G03F 7/70341* (2013.01); *G03F 7/70725* (2013.01)

(58) Field of Classification Search
CPC ......................... G03F 7/70341; G03F 7/70725
See application file for complete search history.

(56) References Cited

U.S. PATENT DOCUMENTS

| 8,587,762 B2 | 11/2013 | Streefkerk et al. |
| 2004/0207824 A1 | 10/2004 | Lof et al. |

(Continued)

FOREIGN PATENT DOCUMENTS

| CN | 101452218 | 6/2009 |
| CN | 102156390 A | 8/2011 |

(Continued)

OTHER PUBLICATIONS

Office Action dated Sep. 27, 2019 issued in corresponding Taiwanese Patent Application No. 107140076.

(Continued)

*Primary Examiner* — Deoram Persaud
(74) *Attorney, Agent, or Firm* — Pillsbury Winthrop Shaw Pittman, LLP

(57) ABSTRACT

An immersion lithography apparatus controller configured to control a positioner to move a support table to follow an exposure route and to control a liquid confinement structure, the controller configured to: predict whether liquid will be lost from an immersion space during at least one motion of the route in which an edge of the object passes under an edge of the immersion space, and if liquid loss from the immersion space is predicted, modify the fluid flow such that a first fluid flow rate into or out of an opening at a leading edge of the liquid confinement structure is different to a second fluid (Continued)

flow rate into or out of an opening at a trailing edge of the liquid confinement structure during the motion of predicted liquid loss or a motion of the route subsequent to the motion of predicted liquid loss.

21 Claims, 9 Drawing Sheets

(56) References Cited

U.S. PATENT DOCUMENTS

| | | | |
|---|---|---|---|
| 2007/0252964 A1 | 11/2007 | Kohno et al. | |
| 2009/0075212 A1 | 3/2009 | Coon et al. | |
| 2009/0122283 A1* | 5/2009 | Hasegawa | G03F 7/70341 355/53 |
| 2009/0201472 A1 | 8/2009 | Kato et al. | |
| 2009/0237632 A1 | 9/2009 | Direcks et al. | |
| 2009/0262316 A1* | 10/2009 | Kohno | G03F 7/70341 355/30 |
| 2010/0045949 A1 | 2/2010 | Nakano et al. | |
| 2010/0208221 A1 | 8/2010 | Kramer et al. | |
| 2010/0214543 A1 | 8/2010 | Stavenga et al. | |
| 2010/0313974 A1* | 12/2010 | Riepen | G03F 7/70341 137/560 |
| 2011/0216292 A1 | 9/2011 | Lafarre et al. | |
| 2011/0255062 A1* | 10/2011 | Philips | G03F 7/70341 137/583 |
| 2011/0261332 A1 | 10/2011 | Cortie et al. | |
| 2012/0162628 A1* | 6/2012 | Van Der Blij | G03F 7/7075 277/303 |
| 2012/0188521 A1* | 7/2012 | Sato | G03F 7/70341 355/30 |
| 2013/0033692 A1* | 2/2013 | Bessems | G03F 7/70341 137/154 |
| 2013/0050665 A1* | 2/2013 | Thomas | G03F 7/70341 355/30 |
| 2013/0050666 A1* | 2/2013 | Nagasaka | G03F 7/70341 355/77 |
| 2013/0059253 A1* | 3/2013 | Nagasaka | G03F 7/70341 355/30 |
| 2013/0070220 A1* | 3/2013 | Bessems | G03F 7/70341 137/561 R |
| 2013/0100425 A1* | 4/2013 | Riepen | G03F 7/70341 355/30 |
| 2014/0285781 A1* | 9/2014 | Sato | G03F 7/70341 355/30 |
| 2016/0320714 A1 | 11/2016 | Grouwstra et al. | |
| 2019/0204758 A1* | 7/2019 | Vieyra Salas | G03F 7/70525 |
| 2019/0361357 A1* | 11/2019 | Hoefnagels | G03F 7/70341 |
| 2020/0409270 A1* | 12/2020 | Van Den Eijnden | G03F 7/70525 |

FOREIGN PATENT DOCUMENTS

| | | |
|---|---|---|
| CN | 102193328 A | 9/2011 |
| CN | 102880016 | 1/2013 |
| EP | 1420298 | 5/2004 |
| JP | 2005-026634 A | 1/2005 |
| JP | 2006261645 | 9/2006 |
| JP | 2011134776 | 7/2011 |
| JP | 2011187954 | 9/2011 |
| KR | 20080075727 | 8/2008 |
| WO | 2016096508 A1 | 6/2016 |
| WO | 2016096508 A1 | 6/2016 |
| WO | 2016096508 A9 | 6/2016 |
| WO | 2017121547 | 7/2017 |
| WO | 2018054658 | 3/2018 |
| WO | 2018072943 | 4/2018 |

OTHER PUBLICATIONS

Office Action dated Sep. 23, 2020 issued in corresponding Chinese Patent Application No. 201780077686.6 with English translation (12 pgs.).
Japanese Office Action issued in corresponding Japanese Patent Application No. 2019-531466, dated Jun. 9, 2020.
International Search Report and Written Opinion issued in corresponding PCT Patent Application No. PCT/EP2017/077950, dated Mar. 20, 2018.
Notice of Reasons for Refusal dated Oct. 19, 2021, issued in corresponding Japanese Patent Application No. 2020-201538 with English translation (5 pgs.).

* cited by examiner

LITHOGRAPHY APPARATUS AND DEVICE MANUFACTURING METHOD

CROSS-REFERENCE TO RELATED APPLICATIONS

This application is the U.S. national phase entry of PCT patent application no. PCT/EP2017/077950, which was filed on Nov. 1, 2017, which claims the benefit of priority of European patent application no. 16203967.1 and European patent application no. 17163003.1, which were filed on Dec. 14, 2016, and Mar. 27, 2017 respectively, and each of which is incorporated herein in its entirety by reference.

FIELD

The present invention relates to a lithography apparatus and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithography apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space.

Defects in the pattern applied to the substrate are undesirable as they reduce the yield, i.e. the number of usable devices per substrate. Because many patterning steps are required to make a device, even a very low rate of defects per exposure can significantly reduce the yield. There are two types of defect that are peculiar to an immersion lithography apparatus.

A droplet of liquid or a liquid film (hereinafter reference to a droplet also encompasses a film; a film being a droplet covering a larger surface area) from the immersion space may be left on the substrate after exposure of a target portion. If the droplet is in contact with the resist for a significant period it can degrade the resist by leaching. If the droplet evaporates, it can leave behind debris and/or may induce a localised cooling. Defects resulting from droplets left on the substrate, whether by resist degradation or evaporation, are referred to herein as trail defects.

A second form of defect peculiar to an immersion lithography apparatus occurs if a bubble is formed in the immersion liquid. If the bubble moves into the path of a projection beam used to project the image of the patterning device onto the substrate, then the projected image will be distorted. One source of bubbles is when escaped liquid on the substrate collides with liquid in the immersion space during relative motion between the immersion space and the substrate. Defects caused by bubbles are referred to herein as exposure defects.

Trail defects and exposure defects may cause problems for objects other than the substrate, such as sensors.

SUMMARY

It is desirable, for example, to provide a system to reduce the occurrence of defects peculiar to an immersion lithography apparatus.

According to an aspect, there is provided an immersion lithography apparatus comprising: a support table configured to support an object having at least one target portion; a projection system configured to project a patterned beam onto the object; a positioner configured to move the support table relative to the projection system; a liquid confinement structure configured to confine a liquid to an immersion space between the projection system and a surface of the object and/or the support table using a fluid flow into and/or out of the liquid confinement structure through a series of openings formed in the liquid confinement structure; and a controller configured to control the positioner to move the support table to follow a route comprised of a series of motions and to control the liquid confinement structure wherein each motion involves the support table moving relative to the liquid confinement structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure, the controller adapted to: predict whether the liquid will be lost from the immersion space during at least one motion of the series of motions in which an edge of the immersion space passes over an edge of the object, and if liquid loss from the immersion space is predicted, to modify the fluid flow such that a first fluid flow rate into or out of an opening of the series of openings at the leading edge of the liquid confinement structure is different to a second fluid flow rate into or out of an opening of the series of openings at the trailing edge of the liquid confinement structure during the motion of predicted liquid loss or a motion of the series of motions subsequent to the motion of predicted liquid loss.

According to an aspect, there is provided a device manufacturing method using an immersion lithography apparatus to project a patterned beam onto a substrate having a plurality of target portions, the method comprising: confining a liquid to an immersion space between a projection system and a facing surface of an object on a support table and/or the support table using a fluid flow into and/or out of the liquid confinement structure through a series of openings in the liquid confinement structure; and moving the support table along a route comprising a series of motions, wherein each motion involves the support table moving relative to the liquid confinement structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure; predicting whether liquid will be lost from the immersion space during at least one motion of the series of motions in which an edge of the immersion space passes over an edge of the object, and if liquid loss from the immersion space is predicted, modifying the fluid flow such that a first fluid flow rate into or out of an opening of the series of openings at the leading edge of the liquid confinement structure is different to a second fluid flow rate into or out of an opening of the series of openings at the trailing edge of the liquid confinement structure during the motion of predicted liquid loss or a motion of the series of motions subsequent to the motion of predicted liquid loss.

According to an aspect, there is provided a fluid handling structure for a lithographic apparatus, the fluid handling structure having a series of openings, the fluid handling structure for provision of fluid and/or liquid therethrough, the fluid handing structure configured such that the openings are directed, in use, towards a substrate and/or substrate table configured to support the substrate, wherein the a first subset of the series of openings is in fluid communication with a first chamber and a second subset of the series of openings is in fluid communication with a second chamber, the first chamber and second chamber being defined between a first member in which the series of openings are defined and a second member, a first portion of one the first and second members extending from a first side of the series of openings between two adjacent openings of the series of openings and into a recess in the other of the first and second members on a second side of the series of openings opposite to the first side, one of the two adjacent openings being in the first subset and the other of the two adjacent openings being in the second subset and the first portion separating the first chamber from the second chamber.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
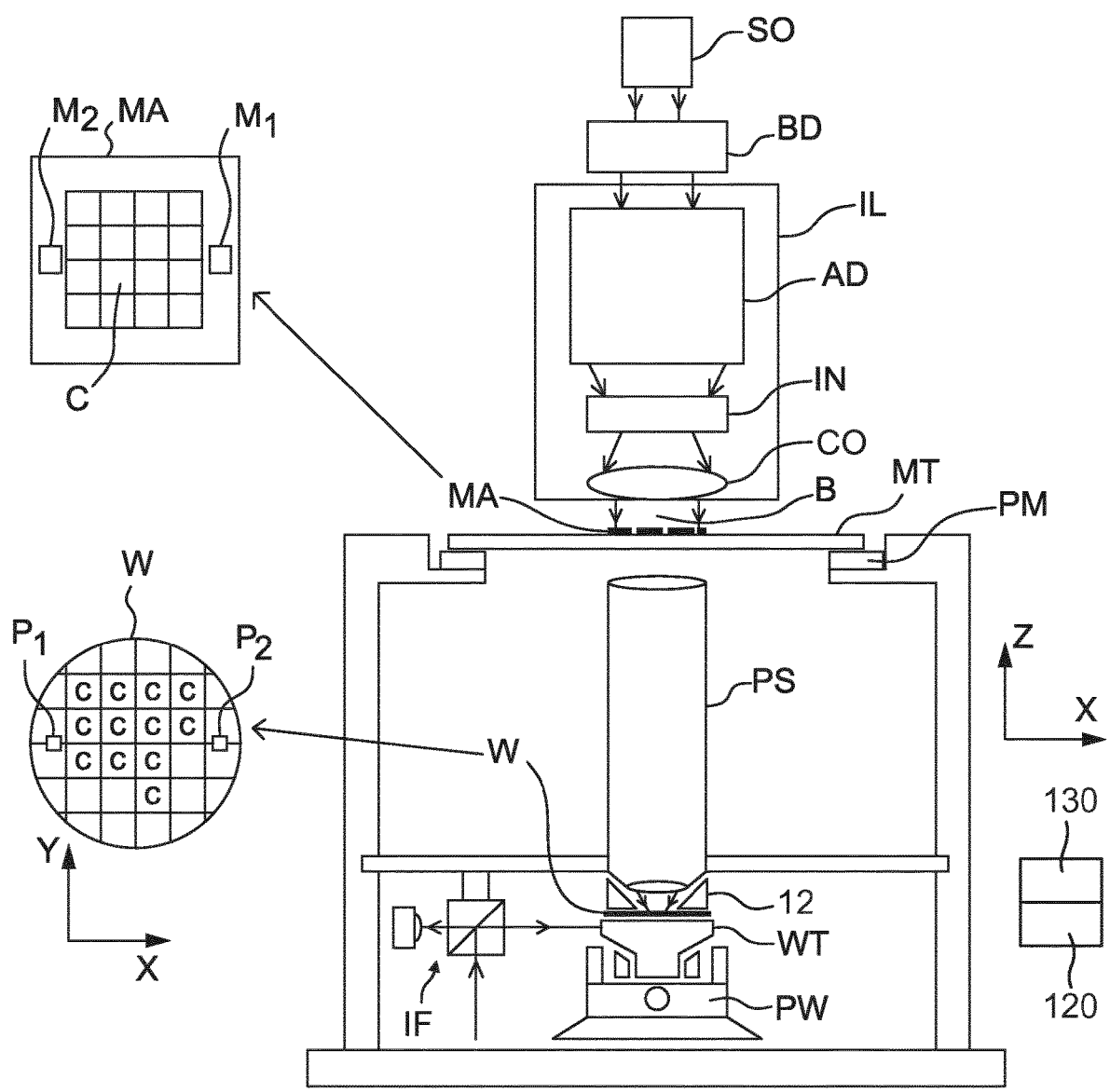
FIG. 1 schematically depicts a lithography apparatus.

FIG. 1 schematically depicts a lithography apparatus according to one embodiment of the invention. The apparatus includes an illumination system (illuminator) ILL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW under control of positioner 130 configured to accurately position the substrate in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stages" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid.

Referring to FIG. 1, the illuminator IL receives a radiation beam from a radiation source SO. The source and the lithography apparatus may be separate entities, for example when the source is an excimer laser. In such cases, the source is not considered to form part of the lithography apparatus. In arrangements where the source is separate from the lithography apparatus, the radiation beam is passed from the source SO to the illuminator IL with the aid of a beam delivery system BD including, for example, suitable directing mirrors and/or a beam expander. In other cases the source may be an integral part of the lithography apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam B having been patterned by the patterning device MA may be referred to as a patterned beam. Having traversed the patterning device MA, the projection beam B passes through the projection system PS, which focuses the beam onto a target portion C of the substrate W. With the aid of the second positioning device PW and position sensor IF (e.g. an interferometric device, encoder or capacitive sensor), the support table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the support table WT or "substrate support" may be realized using a long-stroke module and a short-stroke module, which form part of the second positioning device PW.

The patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device, the patterning device alignment marks M1, M2 may be located between the dies.

The lithographic apparatus further includes a control unit 120 which controls all the movements and measurements of the various actuators and sensors described. The control unit 120 also includes signal processing and data processing capacity to implement desired calculations relevant to the operation of the lithographic apparatus. In practice, the control unit 120 will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
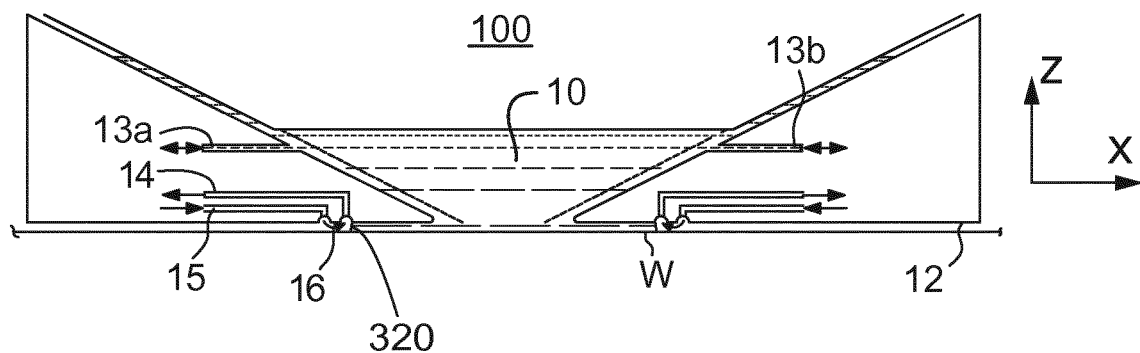
FIG. 2 schematically depicts a liquid confinement structure for use in the lithographic apparatus.

In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the support table WT or substrate W. In an embodiment, a seal is formed between the liquid confinement structure 12 and the surface of the substrate W/support table WT. The seal may be a contactless seal such as a gas seal 16 (such a system with a gas seal is disclosed in European patent application publication no. EP-A-1,420, 298) or a liquid seal.

The liquid confinement structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the liquid confinement structure 12 and the facing surface of the table (i.e. the surface of the substrate W and/or the surface of the support table WT). The gas in the gas seal 16 is provided under pressure via gas inlet 15 to a gap between the liquid confinement structure 12 and substrate W and/or support table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion fluid. The force of the gas on the immersion fluid between the liquid confinement structure 12 and the substrate W and/or support table WT contains the immersion fluid in the immersion space 10. A meniscus 320 forms at a boundary of the immersion fluid. Such a system is disclosed in United States patent application publication no. US 2004-0207824. Other liquid confinement structures 12 can be used with embodiments of the present invention.

Figure 3:
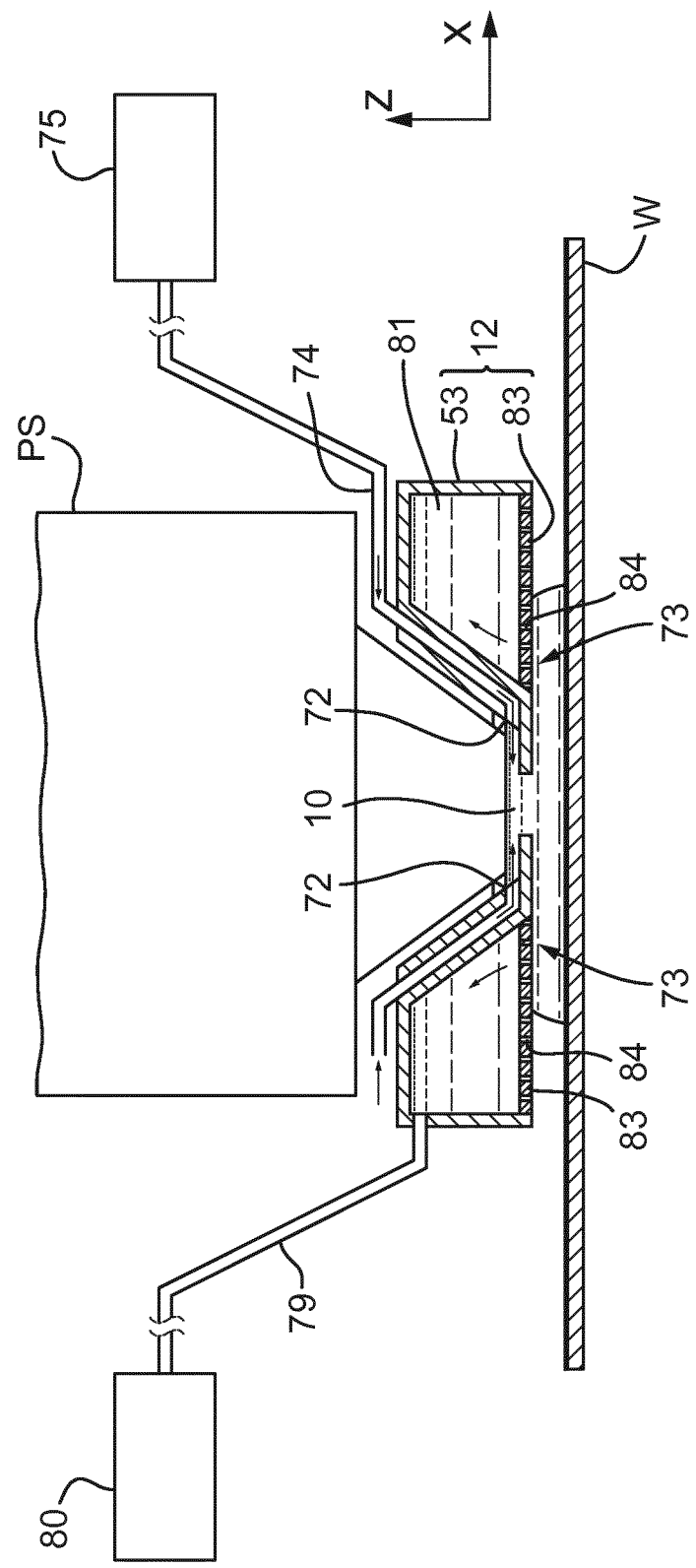
FIG. 3 is a side cross sectional view that schematically depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the immersion space 10 between the final optical element of the projection system PS and the support table WT or substrate W. (Reference in the following text to surface of the substrate W also refers in addition or in the alternative to a surface of the support table WT, unless expressly stated otherwise.)

The liquid confinement structure 12 at least partly contains immersion fluid in the immersion space 10 between the final optical element of the projection system PS and the substrate W and/or support table WT. The immersion space 10 is at least partly formed by the liquid confinement structure 12 positioned below and surrounding the final optical element of the projection system PS. In an embodiment, the liquid confinement structure 12 comprises a main body member 53 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 53 comprises one or more supply ports 72, which are capable of supplying the immersion fluid to the immersion space 10, and a recovery port 73, which is capable of recovering the immersion fluid from the immersion space 10. The one or more supply ports 72 are connected to a liquid supply apparatus 75 via a passageway 74. The liquid supply apparatus 75 is capable of supplying the immersion fluid to the one or more supply ports 72. The immersion fluid that is fed from the liquid supply apparatus 75 is supplied to the one or more supply ports 72 through the corresponding passageway 74. The one or more supply ports 72 are disposed in the vicinity of the optical path at a respective prescribed position of the main body member 53 that faces the optical path. The recovery port 73 is capable of recovering the immersion fluid from the immersion space 10. The recovery port 73 is connected to a liquid recovery apparatus 80 via a passageway 79. The liquid recovery apparatus 80 comprises a vacuum system and is capable of recovering the immersion fluid by sucking it via the recovery port 73. The liquid recovery apparatus 80 recovers the immersion fluid recovered via the recovery port 73 through the passageway 79. The porous member 83 is disposed in the recovery port 73.

In an embodiment, to form the immersion space 10 with the immersion fluid between the projection system PS and the liquid confinement structure 12 on one side and the substrate W on the other side, immersion fluid is supplied from the one or more supply ports 72 to the immersion space 10 and the pressure in a recovery chamber 81 in the liquid confinement structure 12 is adjusted to a negative pressure so as to recover the immersion fluid via the holes 84 (i.e., the recovery port 73) of the porous member 83. Performing the liquid supply operation using the one or more supply ports 72 and the liquid recovery operation using the porous member 83 forms the immersion space 10 between the projection system PS and the liquid confinement structure 12 and the substrate W.

Figure 4:
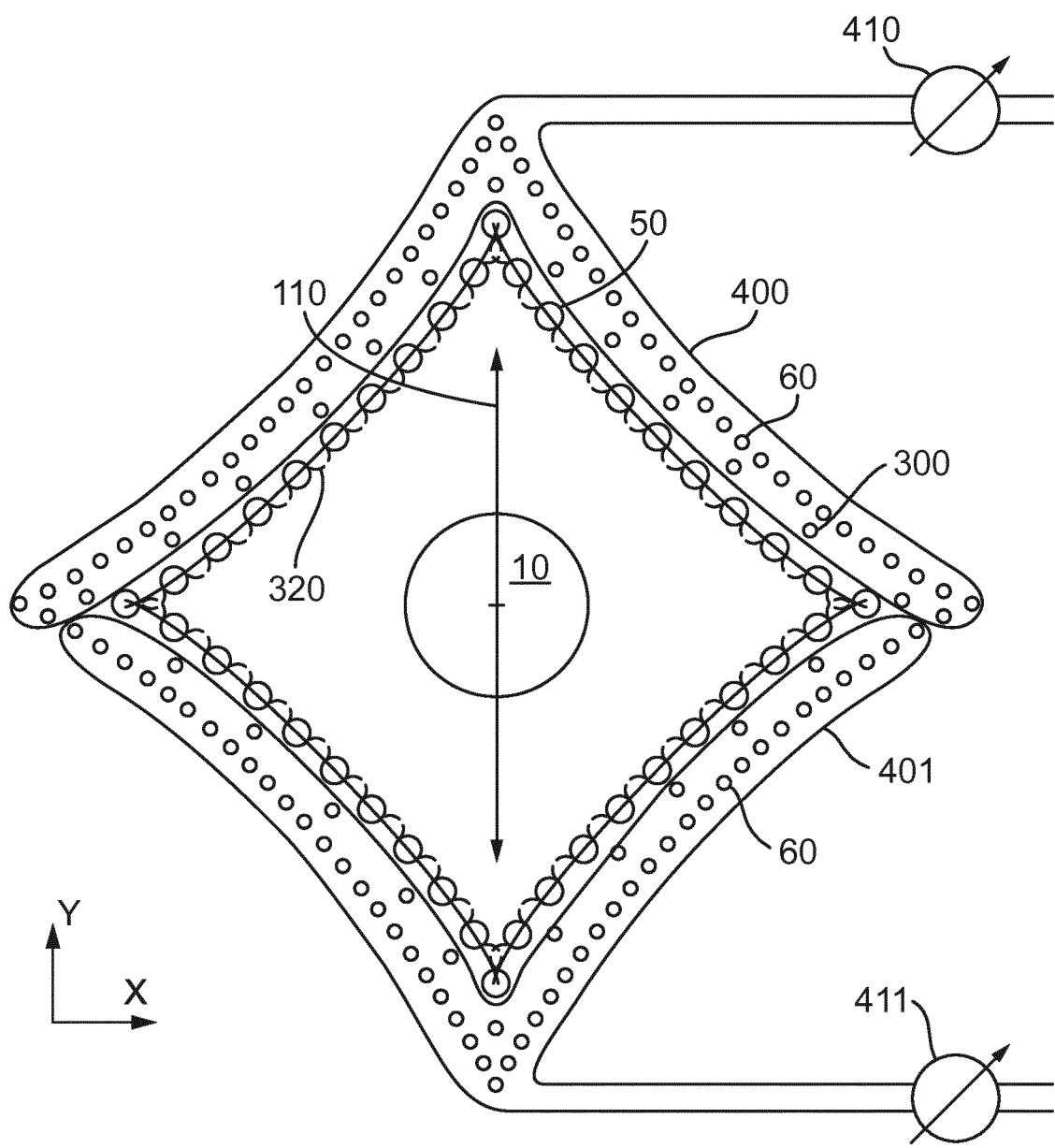
FIG. 4 schematically depicts a bottom surface of another further liquid confinement structure, in plan.

FIG. 4 illustrates schematically and in plan meniscus controlling features of an immersion system including a liquid confinement structure 12 which may have outlets using the gas drag principle and to which an embodiment of the present invention may relate. The features of a meniscus controlling feature are illustrated which may, for example, replace the meniscus controlling features depicted by the gas seal 16, provided by the inlet 15 and the outlet 14 in FIG. 2. The meniscus controlling feature of FIG. 4 is a form of extractor, for example a dual phase extractor. The meniscus controlling feature comprises a series of openings formed in the liquid confinement structure 12, e.g. a plurality of discrete openings 50. Each opening 50 is illustrated as being circular, though this is not necessarily the case. Indeed, the shape is not essential and one or more of the openings 50 may be one or more selected from: circular, elliptical, rectilinear (e.g. square, or rectangular), triangular, etc., and one or more openings may be elongate.

There may be no meniscus controlling features radially inwardly of the openings 50. The meniscus 320 is pinned between the openings 50 with drag forces induced by gas flow into the openings 50. A gas drag velocity of greater than about 15 m/s, desirably about 20 m/s is sufficient. The amount of evaporation of immersion fluid from the substrate W may be reduced, thereby reducing both splashing of immersion fluid as well as thermal expansion/contraction effects.

Various geometries of the bottom of the fluid handling structure are possible. For example, any of the structures disclosed in U.S. patent application publication no. US 2004-0207824 or U.S. patent application publication no. US 2010-0313974 could be used in an embodiment of the present invention. An embodiment of the invention may be applied to a liquid confinement structure 12 which has any shape in plan, or has a component such as the outlets are arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 4. The meniscus 320 of the immersion space 10 has the cornered shape. The cornered shape may be, for example, generally diamond-shaped with rounded corners. The sides may be slightly concave. The corners point in the scan (Y) and non-scan (X) directions so that the principal axes of the cornered shape are substantially orthogonal and respectively substantially parallel to the scan and non-scan directions. The major movements of the support table WT are in the scan and non-scan directions. The wet area corresponding to the interface between the immersion space 10 and the facing surface is sometimes referred to as a 'footprint'. In an embodiment as described, the liquid confinement structure 12 in operation has a footprint having a cornered shape. In another embodiment, the footprint has no corners and it may be substantially elliptical or circular, for example, but the footprint can be any shape.

Known lithographic apparatus may comprise a liquid confinement structure 12 comprising a gas knife. The gas knife can be used to help confine immersion fluid to the immersion space 10. Therefore, the gas knife can be useful in preventing immersion fluid from escaping from the immersion space 10, which could later lead to defects. Providing a strong gas knife is useful in preventing film pulling (where the liquid has a force applied to it due to passing over a sharp edge (e.g. the edge of the substrate) or a different pinning feature such as a hydrophilic surface) because a strong gas knife will reduce or prevent the amount of immersion fluid which is dragged behind the liquid confinement structure 12, and may break up the film faster to reduce the amount of immersion fluid left behind the liquid confinement structure 12. However, when the gas knife is strong, this may make defects on the advancing side of the gas knife worse, because as the gas knife collides with droplets of immersion fluid on the surface of the substrate W, a strong gas knife will not allow immersion fluid droplets to pass inwards of the gas knife. This means that the droplets of immersion fluid will be pushed forwards by the advancing side of the liquid confinement structure 12 which can lead to bulldozing. As film pulling and bulldozing can both cause defects which increase errors and possibly reduce yield, it is beneficial to address both of these issues simultaneously.

In the present invention an immersion lithographic apparatus is provided which comprises a liquid confinement structure 12. The liquid confinement structure 12 may be as described above, for example in relation to FIG. 4. The liquid confinement structure 12 is configured to confine immersion fluid to a region and comprises a gas knife system. The gas knife system may be configured to generate a gas knife in use. The gas knife may be radially outward of the space 10 (otherwise referred to as the region) and may contribute to confining the immersion fluid. The gas knife system comprises a series of openings formed in the liquid confinement structure 12 e.g. the gas knife system comprises passages each having an exit 60. The gas knife may be formed by gas exiting the exits 60 in use. The exits 60 form at least one side of a shape in plan view. The exits 60 may form at least one, multiple or all the sides of the shape in plan view. For example, the exits 60 may form the sides of a four pointed star as shown in FIG. 4. The shape may have a plurality of sides, for example any appropriate number of sides may be provided, e.g. 3, 4, 5, 6, 7, 8, 9, 10 or more. As described above, the exits 60 may form the sides of any shape and this is not particularly limiting. FIG. 4 depicts the scanning direction 110 as in-line with two of the points of the four point star but this may not be the case. The shape formed by the gas knife may be aligned with the scanning direction 110 in any selected orientation.

At least one further series of further openings may be formed in the liquid confinement structure 12 namely at least one further opening 300 may be provided as depicted in FIG. 4. The at least one further opening 300 is for the passage therethrough (out of the liquid confinement structure 12) of a gas. The at least one further opening 300 may be located between the meniscus controlling feature (as depicted by the discrete openings 50 in FIG. 4) and exits 60 of the gas knife. In this context the word "between" means radially outward of the meniscus controlling feature, and radially inward of the exits 60.

As previously described, the substrate W may be moved relative to the liquid confinement structure 12, immersion fluid may be dragged behind the liquid confinement structure 12, e.g., at the receding side of the liquid confinement structure 12 along the scanning direction 110. When the meniscus 320 of the immersion fluid breaks over the surface of the substrate W, a fluid film is left on the substrate W. The film retracts over the whole length of a trailing/receding side of the liquid confinement structure 12. The retracting film will break up into droplets on substrate W in a triangular pattern. The trailing side(s) may be any side of the liquid confinement structure 12 depending on the relative movement of the substrate W. The trailing side may be changed if the direction of relative movement between the substrate W and the liquid confinement structure 12 is changed. These immersion fluid droplets may lead to watermark defects as described above. However, it has been found that providing dry spots along the length of the trailing side of the liquid confinement structure 12 may help reduce the watermark defects resulting from the retraction of the immersion fluid film.

As mentioned, the at least one further opening 300 may be used to provide gas between the meniscus controlling feature and the gas knife. The further opening 300 may be a discrete opening used to provide gas. For example, the gas provided by the at least one additional gas outlet 300 may be $CO_2$ gas. The gas may be provided to create local dry spots along the length of a trailing side of the liquid confinement structure 12. The stagnation pressure of gas exiting the additional gas outlet 300 may be approximately the same as, or greater than, the stagnation pressure of gas exiting the exits 60 forming the gas knife in use.

By creating or promoting dry spots, the film may be broken up into smaller, separate films along the length of the trailing side of the liquid confinement structure 12. The smaller, separate films may retract from several positions along the length of the trailing side of the liquid confinement structure 12 rather than retracting over the full length of the trailing side of the liquid confinement structure 12. Retracting in several smaller portions may result in the droplets forming smaller retraction triangular patterns on the surface of the substrate W. This may therefore decrease the overall amount of immersion fluid and/or the number of droplets left on the surface of the substrate W. In other words, the overall amount of immersion fluid in the smaller triangular patterns is less than it would otherwise be if a larger triangular pattern of droplets was formed from the film retracting along the entire length of the trailing side of the liquid confinement structure 12. Thus, the at least one further opening 300 may be provided to promote drying spots between the meniscus controlling feature and the gas knife to reduce immersion fluid left on the substrate W.

It may be possible to create this effect using only one further opening 300. For example, placing one further opening 300 along the trailing side of the liquid confinement structure 12 may mean that the immersion fluid retracts in two separate film portions rather than one. The further opening 300 may preferably be located to separate the length of the trailing side of the liquid confinement structure 12 into equal portions. For example, a further opening 300 may be provided in an approximately central location along the trailing side of the liquid confinement structure 12. Alternatively, more than one further opening 300 may be provided. For example, one further opening 300 on multiple sides, or per side, of the liquid confinement structure 12 may be provided. 1, 2, 3, 4, 5, 6, 7, 8, 9, 10 etc., or up to 50 or even more further opening 300 may be provided on at least one, multiple or all sides. There may be different numbers of additional further openings 300 on different sides of the liquid confinement structure 12, or at least two sides may have the same number of further opening 300 as each other. The number of further opening 300 is not particularly limiting, and any appropriate number may be used. Having a larger number of further opening 300 means that the amount of immersion fluid left behind on the substrate W may be further reduced and the area over which the remaining immersion fluid is left behind on the substrate W may be located towards the outer edge of the substrate W.

The pitch may be determined as the distance from the center of one further opening 300 to the center of an adjacent further opening 300. This is likely to be determined along a single side of the liquid confinement structure 12. The pitch may be between approximately 5 to 100 times larger than the pitch between adjacent exits 60. The pitch may be greater than or equal to approximately 1 mm. The maximum pitch may be defined by the length of a side of the liquid confinement structure 12 in which only one further opening 300 is provided. In other words, if only one additional further opening 300 is provided along one side, the maximum pitch is not greater than the length of one side. As an example, if the further opening 300 is provided in the middle of a side, the pitch will be half the length of the side. Additionally, the length of the film pulling time will decrease as the number of further opening 300 provided along the trailing side increases. The film pulling time may be the time during which the gas knife loses water droplets outward onto the substrate W. This stops when the fluid starts to retract between the gas knife and the meniscus controlling feature. The pitch may be selected depending on estimated or measured formation of immersion fluid droplets on the surface of the substrate W.

In order to reduce or minimize the cost of ownership of a lithography apparatus, it is desirable to maximize throughput and yield. Throughput is the rate at which substrates are exposed. Yield is the proportion of devices formed on substrates by exposure in an immersion lithographic tool that function correctly. Because many exposure steps may be required to create a device, even a low rate of defects per exposure may result in a significant reduction of yield.

The frequency of occurrence of both trail defects and exposure defects tends to increase as the speed of relative motion between the support table WT and the liquid confinement structure 12 increases. The speed of relative motion during a scanned exposure is referred to as the scan speed. An increase in the scan speed is desirable to increase throughput. An increase in scan speed may lead to an increase in defects because it is more difficult effectively to confine the immersion liquid to the immersion space 10. With increased speed there is an increased risk of instability in the meniscus between the liquid confinement structure and the facing surface. Trail defects and exposure defects tend not to be randomly or uniformly distributed across the area of exposed substrates but occur with higher probability in certain locations. The distribution of trail defects and exposure defects may vary according to the exposure recipe, in particular according to the order of exposure of target portions (i.e. the route comprised of a series of motions which the support table WT follows). Additionally trail defects can be created when the liquid confinement structure 12 moves (partly) over the substrate W after exposure (for example when support table WT exchange occurs or sensor movements are made). To reduce the occurrence of defects, the scan speed may be reduced when exposing certain target portions of a substrate W. However a reduction of scan speed is undesirable as it reduces throughput.

It should be noted that in a lithography apparatus it is normally the support table WT that moves while the projection system PS and liquid confinement structure 12 are stationary. However it is often convenient to describe motions of the support table WT as if the support table WT is stationary and the projection system PS and liquid confinement structure 12 move. An embodiment of the invention applies whether the support table WT and/or the projection system PS/liquid confinement structure 12 move.

To expose a series of target portions, a route comprised of a series of motions is typically calculated in advance. The route may be based on a meandering motion over the surface of the support table WT along successive fields in sequential rows across the substrate W surface. It includes scanning motions of the support table WT for each target portion to be exposed and transfer motions between scanning motions to line up the support table WT for the next scanning motion. During the exposure, the support table WT moves in a scan direction, e.g. the +Y direction, which is substantially perpendicular to the non-scan direction, or a reverse scan direction, e.g. the −Y direction. Exposures in a sequence alternate between the scan direction and the reverse scan direction. The exposure motions and the transfer motions therefore together form the route. The route may also include motions to perform measurements before, during, or after a sequence of exposures and motions for support table WT swap. During a route, the substrate W may move partly or completely out from underneath the liquid confinement structure 12 so that the immersion fluid does not overlap the substrate W. This occurs in particular when exposing an edge target portion, i.e. of a field which is adjacent to or overlaps the edge of the substrate W.

The below description will be given with reference to the immersion space 10 moving over the edge of a substrate W. However, the present invention is equally applicable to cases where the immersion space 10 passes over other objects on the support table WT, for example over a sensor, such as a sensor edge. The present invention will be described with reference to the liquid confinement structure 12 of FIG. 4. However it will be appreciated that other liquid confinement structures 12 including those of FIGS. 2 and 3 could benefit from the present invention. The invention is applicable to any type of liquid confinement structure 12 irrespective of how the immersion fluid is confined to the footprint. For example the invention is applicable to a liquid confinement structure 12 without a flow of gas out of the liquid confinement structure 12 to help confine immersion fluid and also to a liquid confinement structure 12 with a two dimensional array of openings for the extraction of liquid and/or gas (e.g. extraction through a porous member).

Each motion of the series of motions involves the support table WT moving relative to the liquid confinement structure 12. During each motion a portion of the support table WT moving from not being under the liquid confinement structure 12 to being under the liquid confinement structure 12 passes under a leading edge of the liquid confinement structure 12. A portion of the support table WT moving from being under the liquid confinement structure 12 to be not under the liquid confinement structure 12 passes under a trailing edge of the liquid confinement structure 12. During scanning motions the leading edge is the edge of the liquid confinement structure 12 facing the oncoming substrate table WT. With reference to FIG. 4, if the support table WT moves down the page, the top (as illustrated) edge of the liquid confinement structure 12 is the leading edge and the bottom edge (as illustrated) is the trailing edge. The leading edge and trailing edge changes if the scanning direction 110 changes. The leading edge and trailing edge are formed by different portions of the edge of the liquid confinement structure 12 during stepping motions compared to scanning motions. Thus reference to the leading edge and trailing edge below refer to the leading edge and trailing edge of the respective motion.

With reference to the liquid confinement structure 12 of FIG. 4, generally an increase in fluid flow rate through the exits 60 results in immersion fluid being pushed in front of the liquid confinement structure 12 at the leading edge (so called bulldozing). At the trailing edge, an increase in flow rate out of the exits 60 results in lower loss of immersion fluid at the trailing edge for example due to film pulling. A higher flow rate of gas out of further openings 300 at the trailing edge has the effect of breaking up a film of immersion fluid left behind on the support table WT behind the discrete openings 50 and this improves liquid containment by the liquid confinement structure 12. A decrease in flow rate through the exits 60 at a leading edge results in immersion fluid on the support table WT in the path of the liquid confinement structure 12 not being bulldozed and instead passing underneath the exits 60 and thereby being recombined with the immersion fluid by colliding with meniscus 320 and/or being extracted by openings 50.

On the basis of the above principles, the present inventors have found a way to reduce the likelihood of immersion fluid leaking from the immersion space 10 and/or mitigate the consequences of immersion fluid leaking from the immersion space 10 without necessarily needing to slow down scan (or step) speeds. A higher movement speed is possible without leaking of immersion fluid if the gas flow rate out of exits 60 and/or further openings 300 at the trailing edge of the liquid confinement structure 12 is increased during a motion. At the leading edge it is possible to deal with immersion fluid on the support table WT in one of two ways. Either the flow rate out of the exits 60 (and optionally further openings 300, though this is less critical) is reduced. In that case immersion fluid on the support table WT passes under the exits 60 and is recombined with immersion fluid in the immersion space 10 and/or extracted by discrete openings 50. If the amount of immersion fluid left behind on the support table WT is low, this may be a good way of mopping up such immersion fluid (thereby avoiding trail defects). Alternatively the flow rate of gas out of exits 60 (and optionally out of further openings 300, though this is less critical) at the leading edge can be increased. In this way any immersion fluid on the support table WT is likely to be bulldozed out of the way of the liquid confinement structure 12 thereby avoiding large quantities of immersion fluid passing under the exits 60 and colliding with the meniscus 320 extending between the openings 50. In this way the risk of inclusion of bubbles of gas into the immersion space 10 can be reduced thereby reducing the likelihood of exposure defects. This approach may only be appropriate if it can be determined that the bulldozed immersion fluid will move to an acceptable location (e.g. an extraction opening in the support table WT surrounding the substrate W).

FIG. 4 illustrates one way of how advantage of the above observations could be taken. The fluid flow rate through the exits 60 and further openings 300 can be controlled according to the direction of movement of the support table WT. Although it would be possible to do this on an individual exit 60/further opening 300 basis, in the embodiment of FIG. 4 the exits 60 of the series of exits 60 and further openings 300 of the series of further openings 300 are each split into two groups of exits 60 and further openings 300 respectively. The top exits 60 and further openings 300 are all connected to a single chamber 400. A fluid flow rate of fluid into the chamber 400 and out of the corresponding exits 60 and further openings 300 is controlled by a first flow control valve 410. When the support table WT moves down the page, as illustrated, the exits 60 and further openings 300 at the top of the page jointly connected to chamber 400 form a leading edge of the liquid confinement structure 12. The flow rate of gas through the exits 60 and further openings 300 in the leading edge can be switched. The flow rate can be increased and thereby bulldoze away any immersion fluid remaining on the support table WT in the path of the liquid confinement structure 12. Alternatively the flow rate can be reduced thereby allowing liquid in the path of the liquid confinement structure 12 to be reabsorbed into the immersion fluid in the immersion space 10 or be extracted by the discrete openings 50. Conversely, when the support table WT moves up the page under the liquid confinement structure 12, the exits 60 and further openings 300 jointly connected to chamber 400 now form the trailing edge of the liquid confinement structure 12. In that case the fluid flow control valve 410 increases the fluid flow rate into the chamber 400 and thereby out of exits 60 and further openings 300. In this way leaking of immersion fluid is less likely to occur. As illustrated, the remaining exits 60 and further openings 300 at the bottom of the liquid confinement structure 12 as illustrated in FIG. 4 are connected to a second chamber 401 which has a fluid flow rate into it controlled by a second flow control valve 411. Embodiments of how the chambers 400, 401 are implemented are described below with reference to FIGS. 8 to 13.

It will be appreciated that in the embodiment of FIG. 4, the velocity of gas out of exits 60 and further openings 300 at the leading edge and trailing edge (scanning motion) will be substantially the same as the exits 60 and further opening 300 are connected to the common chamber 400, 401.

It will be appreciated that the embodiment of FIG. 4 is optimised for controlling the fluid flow rate out of leading and trailing edges of the liquid confinement structure 12 for movements in the scanning direction 110. However, this need not be the case, for example, four chambers could be provided (one along each of the four edges of the liquid confinement structure 12). In this way during stepping movement (to the left and right as illustrated in FIG. 4) all of the exits 60 and further openings 300 on trailing and leading edges could have their fluid flow rate controlled as well as the leading and trailing edges during the scanning movements.

It will be appreciated that common chambers 400, 401 could be provided for any shape, in plan, of the liquid confinement structure 12. Additionally any number of chambers 400, 401 with associated flow control valves 410, 411 could be provided. The same principles could be applied to the discrete openings 50 forming a series of openings defining the meniscus pinning feature. In a further embodiment the exits 60 and further openings 300 could be provided with separate common chambers. In an embodiment any combination of the exits 60, further openings 300 and discrete openings 50 could be provided with common chambers.

The same principles can be applied to other liquid confinement structures, including those illustrated in FIGS. 2 and 3.

One way of taking advantage of the above described characteristics would be for the flow rate of gas out of the exits 60 (and/or further openings 300) to be varied according to the direction of travel of the support table WT under the liquid confinement structure 12. However, this would require frequent changes in gas flow rate (for each change in direction).

As explained above, it is undesirable to change the fluid flow rate as frequently as changes in direction of the support table WT and the liquid confinement structure 12 occur because of lifetime concerns over the flow control valves 410, 411. Therefore the present inventors have devised the present invention in which the advantages of the above mentioned possibilities are taken, without the need for switching of fluid flow rates for each change in direction. Additionally, the present invention allows different changes in flow rate to be implemented, such as increasing a flow rate out of the exits 60 at the leading edge, which as described below may be advantageous in certain circumstances instead of always decreasing the flow rate out of the exits at the leading edge.

The present invention allows the fluid flow rates into or out of the opening of the series of openings mostly to be at a predetermined constant rate. Only if liquid is predicted to be lost and/or interaction of the liquid confinement structure 12 with previously lost liquid is the flow rate varied. This means that it is not necessary constantly to switch the flow rate. Thus the lifetime of any valve involved in switching the flow rate is increased.

In the invention, the control unit 120 predicts whether liquid will be lost from the immersion space 10 during at least one motion of the series of motions in which an edge of the immersion space 10 passes over an edge of the substrate W. These are the motions where liquid loss is most likely. If liquid loss from the immersion space 10 is predicted, the fluid flow rate out of at least one opening is varied during the motion of predicted liquid loss (to avoid or reduce the amount of liquid loss) or during a motion of the series of motions subsequent to the motion of predicted liquid loss (to mitigate the effect of lost liquid). The control unit 120 does this by modifying a first fluid flow rate into or out of an opening of a series of openings at the leading edge of the liquid confinement structure 12 is different to a second fluid flow rate into or out of an opening of the series of openings at the trailing edge of the liquid confinement structure 12.

The discrete openings 50 (forming the meniscus controlling feature) can be seen as openings of a series of openings. The exits 60 can be seen as openings of a series of openings (forming the gas knife). Further openings 300 can be seen as openings of a series of openings (of a film breaking up feature).

The way in which the loss of liquid can be predicted will now be explained.

It has been found that during execution of a route when an edge of a substrate W on the support table WT moves under the edge of the immersion space 10 defined by the meniscus 320, immersion fluid loss from the immersion space 10 is most likely to occur. The liquid left behind can lead to trail defects or exposure defects. For example, if the liquid is left behind in a single position on the substrate W, this can lead to leaching defects. Additionally or alternatively if the liquid is left behind too long at a single position, the remaining liquid can evaporate leading to a deleterious cooling load at that position. Additionally or alternatively, if a subsequent motion of the route results in the meniscus 320 colliding with leaked liquid left behind from a previous motion, this can result in bubble formation in the immersion space 10. Such bubble formation can result in exposure defects.

Reducing the speed of the motion when the edge of the immersion space 10 passes over the edge of the substrate W, reduces the chance of liquid loss from the immersion space 10. However, such a system may not optimise throughput because certain motions over an edge, which would not have led to liquid loss, are unnecessarily performed at reduced speed. End users may have different requirements. Some end users may prefer a reduction in throughput in exchange for lower defectivity; whereas other customers may require higher throughput at the expense of more defects.

The present inventors have established that there is an experimentally measurable relative speed of an edge of the immersion space 10 relative to an edge of the substrate W above which liquid loss from the immersion space 10 will occur and below no liquid loss from the immersion space 10 will occur. This experimentally measured parameter depends on many variables including, but not limited to: the type of liquid confinement structure 12 used and the parameters under which it operates (for example fluid flow speeds, fluid volume flow rate and distance between the bottom surface of the liquid confinement structure 12 and the substrate W), as well as features of the substrate W such as the roundness of the edge, the substrate W edge bevel, local temperature variations, the way in which the edge of any photoresist on the substrate W has been treated (a so called edge bead removal strategy), the type of photoresist used and the static receding contact angle of the immersion fluid on the top surface of the substrate W.

Figure 5:
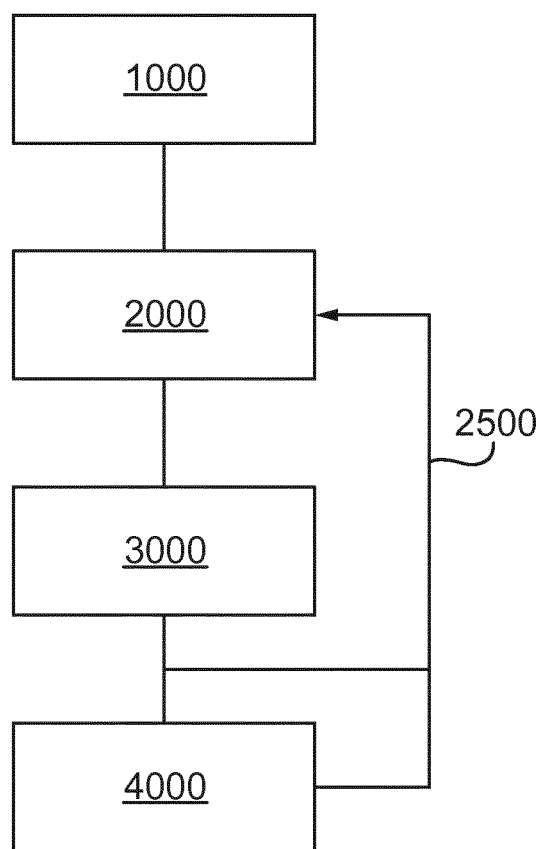
FIG. 5 is a flow diagram of the program followed by a controller.

FIG. 5 is a flow diagram illustrating how the control unit 120 controls the positioner 130 of the support table WT using the above insight. The flow diagram of FIG. 5 suggests that a process is followed step by step. However, this may not be the case, but is described in this way below to aid understanding. In an embodiment all the steps in the loop 2000-4000 are calculated simultaneously, for example using matrix operations. This embodiment may be preferred as the calculations can be performed faster. This embodiment may be most suited to the case where the process is performed during implementation of the route (described below).

Details of the desired route are sent to the control unit 120 at step 1000. The information regarding the route includes information regarding the location of the immersion space 10 relative to the object at the start of a motion, the location of the immersion space 10 relative to the object at the end of a motion and the speed of movement and direction between the location at the start of the motion and the location at the end of the motion. The control unit 120 proceeds to step 2000 for a motion of the route in which an edge of the immersion space 10 passes over an edge of the object. The control unit 120 determines in step 2000 a speed of the edge of the immersion space 10 relative to the edge of the object. In step 3000 the control unit 120 predicts if the motion is likely to result in liquid loss. The control unit 120 does this by comparing the speed determined in step 2000 to a predetermined parameter. If the speed determined in step 2000 is greater than the predetermined parameter, a prediction of liquid loss is made.

In an embodiment, the predetermined parameter is representative of a speed. The predetermined parameter may be a speed experimentally determined at which liquid loss from the immersion space 10 occurs.

In step 4000, for those motions where liquid loss is predicted in step 3000, one or more parameters of the route during the at least one motion for which liquid loss has been predicted can be modified. The modification may reduce the amount of liquid lost during the motion, or may attempt substantially to avoid any liquid loss.

After step 4000, the control unit 120 may return via loop 2500 to step 2000. In an embodiment the control unit 120 may, or may not, repeat steps 2000 and 3000 (and optionally 4000) on the motion which the control unit 120 has just modified. The repetition may be performed in order to check whether or not it is appropriate to avoid or reduce the predicted liquid loss even further. This can be seen as a check to see whether the modifications made in step 4000 are effective to achieve the desired reduction in liquid loss from the immersion space 10.

The predetermined parameter may be experimentally determined. For example, the predetermined parameter may be a speed of an edge of the immersion space 10 in a direction normal to the edge of the object above which liquid is found to escape from the liquid confinement structure 12 when the edge of the immersion space 10 passes over the edge of the object. The predetermined parameter may be determined by moving the edge of a test object under the edge of the immersion space 10 at a plurality of different speeds of the edge of the immersion space 10 in a direction normal to the edge of the test object. The predetermined parameter may then be set to be a value between a speed at which substantially no liquid is lost from the immersion space 10 and a speed at which liquid is lost from the immersion space 10. In an alternative embodiment the predetermined parameter may be the minimum speed at which a meniscus of immersion fluid extending between a surface of the liquid confinement structure 12 and a surface of the substrate W in the immersion space 10 is unstable at the edge of the test object.

In an embodiment the predetermined parameter may not be experimentally determined. For example, an operator may select an arbitrary predetermined parameter. The operator may then decide on the basis of the throughput achieved and the defectivity rate whether to increase or decrease the predetermined parameter. An increase in the predetermined parameter would result in higher throughput but may well result in higher defectivity as well. A reduction in the magnitude of the predetermined parameter would mean that more motions of the series of motions of the route have a reduced speed meaning lower throughput but likely a lower defectivity rate.

If a particular motion has a predicted speed of the edge of the immersion space 10 relative to the edge of the object greater than the predetermined parameter, this results in a prediction of liquid loss from the immersion space 10. The control program may modify one or more parameters of the route during the motion for which liquid loss is predicted or a motion of the series of motions subsequent to the motion of predicted liquid loss.

In the present invention the one or more parameters which are modified is a fluid flow such that a first fluid flow rate into or out of an opening of a series of openings at the leading edge of the liquid confinement structure 12 is different to a second fluid flow rate into or out of an opening of the series of openings at the trailing edge of the liquid confinement structure 12. As will be described below, whether the first fluid flow rate is increased or decreased from the usual predetermined constant rate and/or whether the second fluid flow rate is increased or decreased from the usual predetermined constant flow rate during the motion in which liquid is predicted to be loss (thereby to eliminate or reduce the likelihood of liquid loss) or during a motion of a series of motions subsequent to the motion of predicted liquid loss (in which case steps are taken to mitigate the effect of the loss liquid) depends on several factors.

In an embodiment the control unit 120 is adapted, if liquid loss from the immersion space 10 is predicted, to modify the fluid flow by increasing the second fluid flow rate into or out of a series of openings at trailing edge of the liquid confinement structure 12. This may either be the series of openings forming the gas knife (i.e. the exits 60) and/or the series of openings formed by the further openings 300 at the trailing edge, for example. In either way the liquid confinement ability of the liquid confinement structure 12 is thereby increased, meaning that the predicted liquid loss is less likely to occur. This increase in fluid flow rate such that the first flow rate and second fluid flow rate are different happens during the motion of predicted liquid loss.

In the above described embodiment, where the predicted liquid loss is attempted to be reduced or eliminated by changing fluid flow during the motion of predicted liquid loss, the first fluid flow rate into or out of the series of openings at the leading edge of the liquid confinement structure 12 is preferably unmodified (i.e. maintained at the predetermined constant rate) and the second fluid flow rate into or out of the series of openings at the trailing edge of the liquid confinement structure 12 is increased above the predetermined constant rate.

It is also possible to change the fluid flow rate into the discrete openings 50 at the trailing edge. An increase in the fluid flow rate into discrete opening 50 is effective to improve the containment ability at the trailing edge.

In another embodiment, if liquid loss is predicted (even if the first and/or second fluid flow rate are modified during the motion of predicted liquid loss) the first fluid flow rate and second fluid flow rate may be modified to be different during a motion of the series of motions subsequent to the motion of predicted liquid loss. The way in which it is decided what modification to the fluid flow to make in this embodiment is described below.

In an embodiment, the control unit 120 makes further a calculation after step 3000 before deciding whether or not to continue on to step 4000 if liquid loss is predicted in step 3000. For example, the control unit 120 may decide that the position of leaked liquid, the amount of leaked liquid and/or the time leaked liquid spends at one location results in a low risk of any defects arising as a result of the immersion fluid loss. If a low risk of defect is determined, the risk of liquid loss may be accepted and the control unit 120 returns to step 2000 without modifying one or more parameters of the route in step 4000. Therefore a step of determining whether or not it is appropriate to avoid or reduce the predicted liquid loss may be carried out after step 3000 before proceeding onto step 4000. If it is determined that it is not appropriate to avoid the predicted liquid loss, the control unit 120 takes loop 2500 without proceeding to step 4000. If it is determined that it is appropriate to reduce predicted liquid loss, the control unit 120 proceeds to step 4000.

In an embodiment the control unit 120 forecasts any movement of liquid from the liquid loss on the substrate W during subsequent motions of the route. For example, leaking of liquid can be predicted to occur throughout the motion or until the liquid confinement structure 12 changes direction (by more than a certain minimum amount). The interaction of that leaked liquid with the liquid confinement structure 12 can also be predicted. Liquid which is left behind on the substrate W may be absorbed into the immersion space 10 when the liquid confinement structure 12 passes over the liquid. On the other hand, the leaked liquid may be pushed in front of the liquid confinement structure 12 (bulldozing), for example by the radially outer gas knife component (exits 60) of the liquid confinement structure 12. The liquid may work its way around the outside of the liquid confinement structure 12 and be left behind the liquid confinement structure 12 on the substrate W as a trail of droplets. A trail of droplets is also left behind from the initial leaking (termed trailing droplets). The simulation accounts for both types of droplet as well as absorbed liquid and bulldozed droplets can later become trailing droplets, for example. The movement of liquid may be the result of interaction of the liquid with the liquid confinement structure 12 during a subsequent motion. For example, it is determined whether the liquid which remains on the substrate W is in the path of the immersion space 10 for one or more subsequent motions. The control unit 120 may then determine the amount of time which the liquid of the loss liquid spends in one particular place on the substrate W. If the time that the liquid of the loss liquid spends in one position on the substrate W is determined to be greater than a predetermined leach limit or predetermined evaporation limit, it can be determined that the liquid loss should be avoided or reduced. The predetermined leach limit can be seen as a time above which leach defects can be expected. The predetermined evaporation limit can be seen as a time above which trail defects or localised cooling defects resulting from evaporation (e.g. particulate matter or localised cooling) can be expected. The predetermined leach limit and predetermined evaporation limit may be experimentally determined by carrying out experiments to determine after what time periods leach defects occur or when evaporation defects occur. Alternatively or additionally those parameters can be selected based on experience.

In an embodiment the control unit 120 may make an estimate of the quantity of the liquid loss expected during the at least one motion. In an embodiment an estimate of the quantity of the liquid loss can be made on the basis of the difference between the normal directions 2004, 2006 (see FIG. 6). For example, if the angle between the normal directions 2004, 2006 is smaller, this may be indicative of a larger liquid loss.

Thus the control unit 120 can forecast the presence of lost liquid in at least one motion in a path of the immersion space 10 in a subsequent motion to the at least one motion. The control unit 120 may therefore advantageously be adapted to modify the fluid flow during the subsequent motion in which the loss liquid is forecast to be present in the path of the immersion space 10. Thus the above described interaction of the fluid flow out of the exits 60 forming the gas knife on a leading edge of the liquid confinement structure 12 with liquid in the path of the immersion space 10 can be taken advantage of.

For example, the fluid flow rate out of the exits 60 at the leading edge of the liquid confinement structure 12 may be decreased if it is determined that a quantity of lost liquid in the path of the immersion space 10 during the subsequent emersion is less than a predetermined maximum quantity. Therefore if the amount of liquid lost and left present on the support table WT is small, the flow rate out of exits 60 can be reduced thereby allowing the lost liquid to pass under the gas knife formed by the exits 60 (rather than being bulldozed out of the way by it) so that the liquid is reabsorbed into the immersion fluid into the immersion space 10 or extracted through discrete openings 50. When the amount of liquid is small, and is allowed to pass the gas knife, the risk of large bubbles being entrained in the immersion fluid in the immersion space 10 and resulting in imaging defects is small because any bubbles of gas are likely to be small and are likely to have been completely dissolved before they reach the area through which irradiation of the substrate W occurs.

Conversely, if it is determined by the control unit 120 that the quantity of the lost liquid in the path of the immersion space 10 during a subsequent motion is greater than a predetermined minimum quantity, the fluid flow rate out of the exits 60 of the gas knife at the leading edge can be increased. In this way the liquid in the path of the liquid confinement structure 12 will be bulldozed out of the way thereby preventing it from colliding with the meniscus 320 extending between the discrete openings 50 and thereby entrapping large bubbles of gas into the immersion fluid which have a high risk of not dissolving before entering the area through which irradiation of the substrate W.

Another scenario where the control unit 120 might increase the fluid flow rate out of the exits 60 at the leading edge is if it is forecast that bulldozing lost liquid in this way would result in the liquid being pushed to a position at which it is acceptable for the liquid to be present. For example, a position where it might be acceptable for the lost liquid to be present may be a position off the surface of the substrate W. For example, the liquid may be moved to an outlet in the support table WT surrounding the substrate W through which the immersion fluid can be extracted.

The way in which it is decided what modification to the fluid flow to make is described below.

The inventors have found that the relative speed above which liquid loss from the immersion space 10 occurs is also dependent upon the relative orientations of the edges of the immersion space 10 and substrate W. In an embodiment the control unit 120 determines the speed of the edge of the immersion space 10 in a direction normal to the edge of the substrate W during the at least one motion. This speed gives an even more accurate determination of whether or not liquid is likely to leak from the immersion space 10 during the motion.

In order to determine the speed of the edge of the immersion space 10 in a direction normal to the edge of the substrate W during the at least one motion, the control unit 120 is provided with geometrical information regarding the likely shape, in plan, of the immersion space 10. In addition, the control unit 120 is provided with data relating to the shape of the edge of the substrate W. In an embodiment in step 2000 the edge of the immersion space 10 is treated as a plurality of discrete immersion space edge portions. The edge of the substrate W may be treated in the same way, namely as a plurality of discrete object edge portions.

The control unit 120 determines the speed of the discrete immersion space edge portions in a direction normal to the edge of the discrete object edge portions over which the discrete immersion space edge portion passes. The determined speeds can be termed discrete immersion space edge portion speeds. Each of the discrete immersion space edge portion speeds calculated for a particular motion is then compared in step 3000 to the predetermined parameter. In an embodiment, if any of the discrete immersion space edge portion speeds for a given motion are greater than the predetermined parameter, the control unit 120 moves to step 4000. If the comparison step 3000 shows that the predicted discrete immersion space edge portion speeds are not greater than the predetermined parameter, the control unit 120 returns via loop 2500 back to step 2000 to predict the discrete immersion space edge portion speeds for the next motion of the series of motions of the route. In an alternative embodiment, only if more than a certain number of the discrete immersion space edge portion speeds exceed the predetermined parameter, does the control unit 120 progress to step 4000.

After modifying the one or more parameters of the route in step 4000, the control unit 120 returns via loop 2500 to step 2000 to predict the immersion space edge portion speeds for the next motion of the series of motions of the route.

The discretising of the edge of the immersion space as plurality of discrete immersion space edge portion is also a convenient way for the control unit 120 to determine whether or not an edge of the immersion space 10 passes over the edge of a substrate W. For example, if one or both ends of one of the immersion space edge portions passes over an object edge portion during the motion of the route, the control unit 120 determines that an edge of the immersion space 10 passes over the edge or the substrate W. In an embodiment only if it is determined that an edge of the immersion space 10 passes over the edge of the substrate W, is the speed of the edge of the immersion space 10 relative to the edge of the substrate W predicted.

Figure 6:
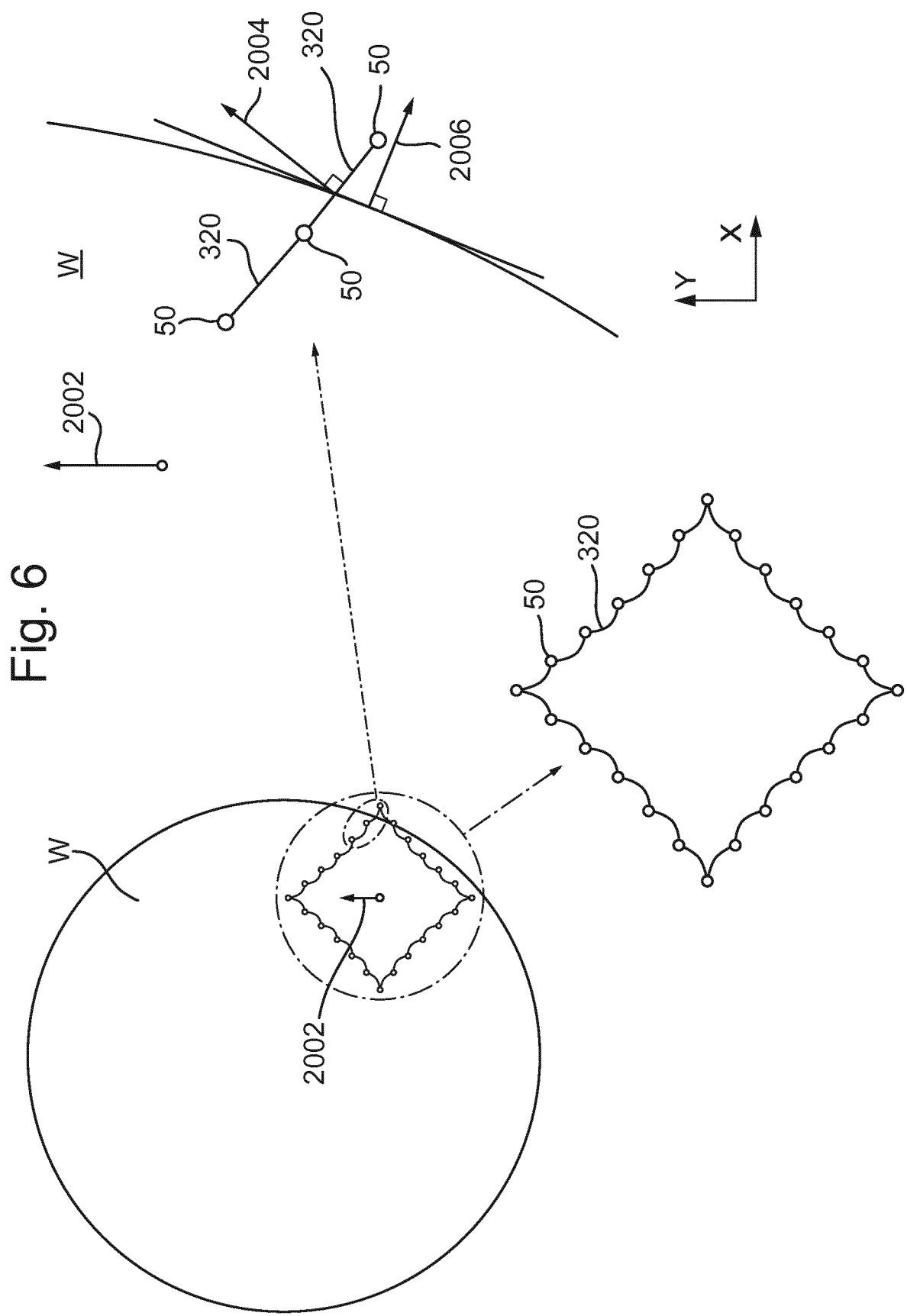
FIG. 6 is a schematic illustration, in plan, of an edge of the immersion space and an edge of the substrate.

In an embodiment, as for example illustrated in FIG. 6, the liquid confinement structure 12 comprises a plurality of extraction openings 50 in a bottom surface (i.e. a surface facing the surface of the substrate W). The openings 50 are for the extraction of gas from outside of the immersion space 10 and/or extraction of the immersion fluid from inside the immersion space 10. The meniscus 320 of the immersion fluid extends between adjacent openings 50. It is convenient to discretise the edge of the immersion space 10 into the plurality of the discrete immersion space edge portions by assigning the discrete immersion space edge portions as extending between one or more sequential openings 50, for example between adjacent openings 50.

As illustrated in FIG. 6, in an embodiment the control unit 120 calculates a normal direction of the discrete immersion space edge portion. A motion direction of the liquid confinement structure 12 is illustrated by arrow to 2002. For the immersion space edge portion magnified in the Figure a normal direction 2004 can be calculated. In the same way a normal direction 2006 of the object edge portion (perpendicular to the tangent 2005 to the object edge portion) is calculated.

Figure 7:
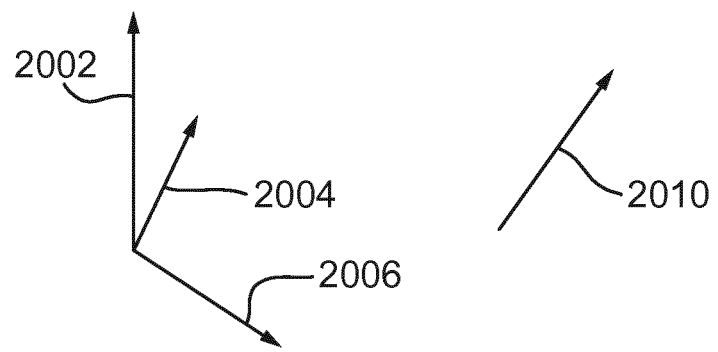
FIG. 7 illustrates vector analysis performed in an embodiment by the controller

The meniscus 320 experiences a force on it in the direction of its normal 2004 due to the motion 2002 of the substrate W relative to the liquid confinement structure 12. The local velocity experienced by the meniscus 320 relative to the substrate W is then calculated by resolving the velocity of the liquid confinement structure 12 relative to the substrate W in the normal direction 2004 of the meniscus 320. The component of the local velocity in the direction of the normal 2006 to the object edge portion is then calculated. This component is referred to as the contact line speed and is compared to the predetermined parameter. Thereby a speed of an edge of the immersion space 10 relative to an edge of the object is calculated. Vector analysis may be used to calculate this speed. Thus a relative velocity of the two normal directions 2004, 2006 due to the at least one motion is calculated and its magnitude compared to the predetermined parameter. The two normal directions 2004, 2006 and the at least one motion 2002 are illustrated in FIG. 7. A resulting vector 2010 representative of the relative velocity of the normal to the discrete immersion space edge portion in a direction normal to the discrete object edge portion is calculated. In an embodiment, the magnitude of the relative velocity is taken as the speed which is then compared in step 3000 to the predetermined parameter.

The control unit 120 may perform the above described process (e.g. predict, compare and modify) during the implementation of the route. That is, the control unit 120 may perform steps 2000-4000 whilst the liquid confinement structure 12 is already following the route. In an alternative embodiment the control unit 120 may perform steps 2000-4000 on the route off line, prior to the modified route being executed by the immersion apparatus.

In an embodiment, instructions to calculate or perform the route may take the form of a computer program containing one or more sequences of machine-readable instructions describing a method as disclosed above, or a data storage medium (e.g. semiconductor memory, magnetic or optical disk) having such a computer program stored therein. The computer program can be applied as an upgrade to an existing lithography apparatus.

Figure 11:
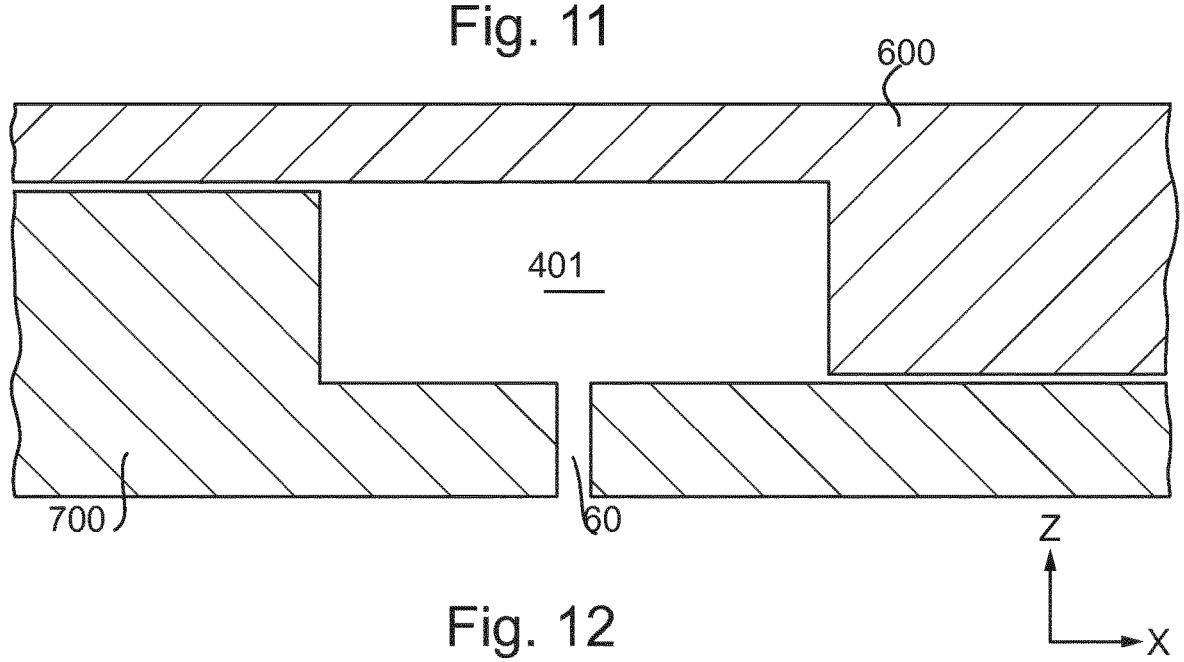
FIG. 11 is a cross-section through line I-I in FIG. 8.
Figure 12:
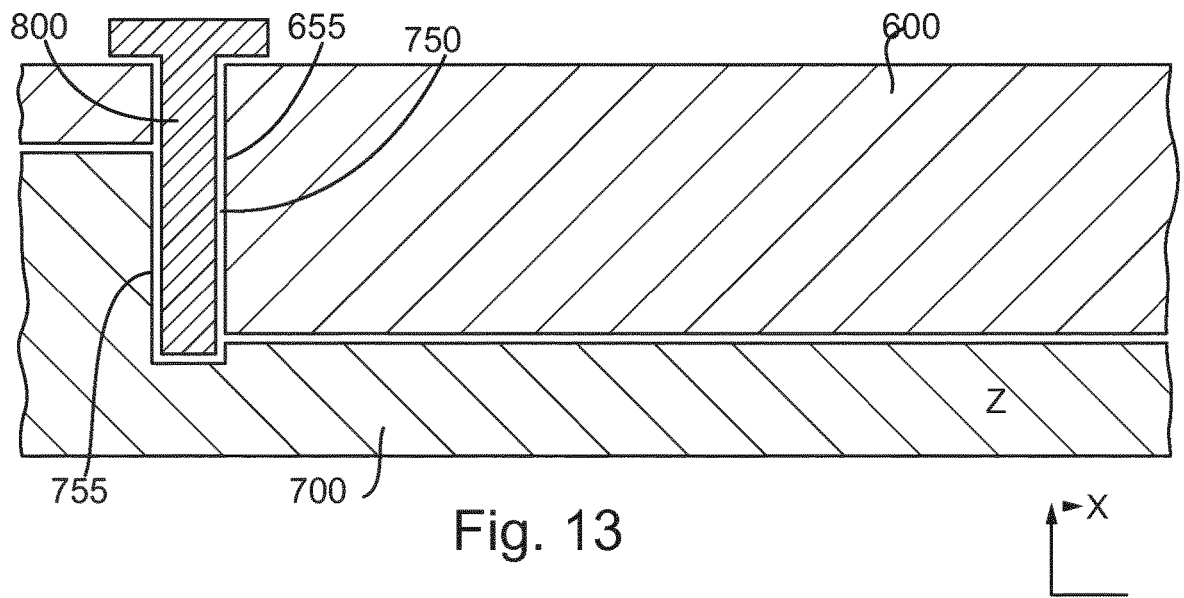
FIG. 12 is a cross-section through line II-II in FIG. 10.

A practical implementation of the two (or more) chambers 400, 401 in the fluid handling structure of FIG. 4 will now be described with reference to FIGS. 8 to 13. FIGS. 8 to 10 and 13 are cross-sections taken in the ZX plain and FIGS. 11 and 12 are cross-sections taken in the YZ plain. The below description will be made with reference to the exits 60 being in fluid communication with the chambers 400, 401. However, the invention can be applied to segment any other series of openings such as the further openings 300 and/or openings 50 in the fluid handling structure 12.

A difficulty with providing the first chamber 400 with which a first sub-set of the series of openings 60 is in fluid communication and a second sub-set of the series of openings 60 in fluid communication with the second chamber 401 is that the openings 60 of the series of openings are very close together. As a result any wall separating the two chambers 400, 401 must be extremely thin. A thin wall is not guaranteed to provide a good seal thereby to prevent leakage between the first chamber 400 and second chamber 401. If leakage between the first chamber 400 and the second chamber 401 is too great, then individual switching of flows out of the first sub-set of the series of openings 60 and the second sub-set of the series of openings 60 cannot be achieved.

Generally the first chamber 400 and second chamber 401 are defined by separate second member 600 and first member 700 which are brought together to define the first chamber 400 and the second chamber 401 between them. A potential for leakage occurs at the joins of the separate second member 600 and first member 700.

Figure 8:
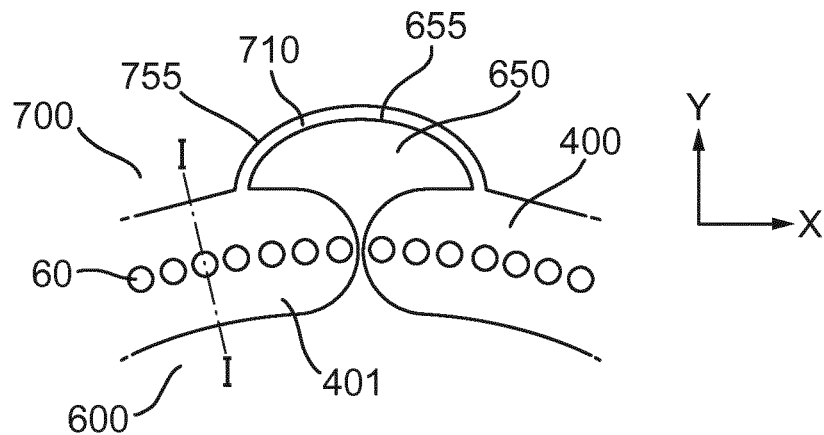
FIG. 8 is a cross-sectional view of a detail of the separation between a first chamber and a second chamber of a liquid confinement structure.

An embodiment is illustrated in FIG. 8. In the embodiment of FIG. 8 the openings 60 are formed in the first member 700. A cross-section through line I-I in FIG. 8 is illustrated in FIG. 11. As can be seen, the first member 700 forms a bottom and side of the second chamber 401. The second member 600 defines the remaining side and top of the second chamber 401.

In order to partition the first chamber 400 from the second chamber 401, a portion 650, as most clearly seen in FIG. 8, is a part of the second member 600 and extends from one side of the series of openings 60, between two adjacent openings 60 of the series of openings to the other side of the series of openings. The portion 650 is monotonic with the second member 600.

A seal needs to be formed between the bottom of the portion 650 and the upper surface of the first member 700 which defines the bottom of the first chamber 400 and the second chamber 401. Additionally a seal must be formed between the leading surface 655 of the portion 650 and the side wall of the first member 700 defining the side of the first chamber 400 and the second chamber 401.

The seal between the bottom surface of the portion 650 and the first member 700 can form an adequate seal because clamping of the first member 700 and the second member 600 together can be achieved tightly.

However, the seal between the leading surface 655 of the portion 650 and the side of the first member 700 defining the first chamber 400 and the second chamber 401 is more problematic. For this reason a recess 710 is formed in the first member 700 on a second side of the series of openings 60 opposite to a first side from which the portion 650 projects from the second chamber 401. The portion 650 extends into the recess 710. In this way a longer seal than would otherwise be present is formed between the leading surface 655 of the portion 650 and a surface 755 of the recess 710. A longer seal length is present which is effective to provide a degree of decoupling between the pressures in the first chamber 400 and the second chamber 401. Additionally the thickness of the portion 650 is not constant. That is, the portion 650 is thin where it is positioned at a first part between the two adjacent openings 60 compared to a second part of the portion 650 which is in the recess. This is also effective to further increase the length of the seal, thereby yet further improving the sealing between the first chamber 400 and second chamber 401.

At least two portions 650 may be provided to separate the first chamber 400 and the second chamber 401 at each end. Additionally the portion 650 could be provided in the first member 700 and the recess 710 in the second member 600 (i.e. the opposite way to that illustrated). However, in terms of ease of manufacturability, it is easier to manufacture if the portion 650 is provided in the member which does not have the series of openings 60 defined therein.

Figure 9:
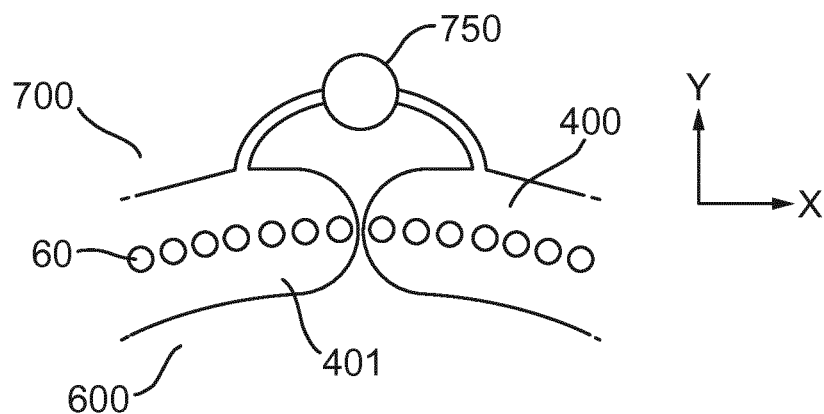
FIG. 9 is a cross-sectional view of a detail of the separation between a first chamber and a second chamber of a liquid confinement structure in a stage of construction.
Figure 10:
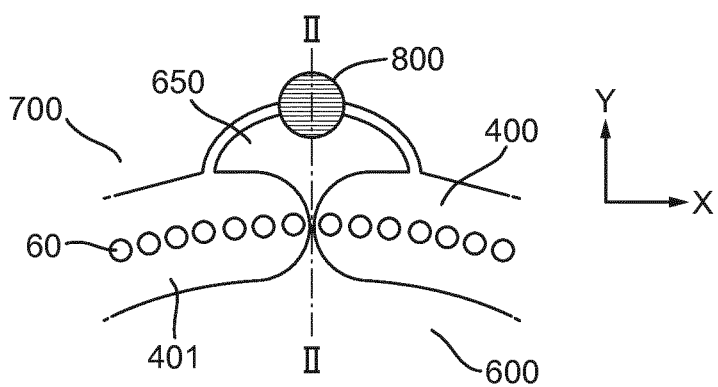
FIG. 10 is a cross-sectional view of a detail of the separation between a first chamber and a second chamber of a liquid confinement structure.

FIGS. 9, 10 and 12 illustrate a further refinement which improves the sealing capability of the embodiment illustrated in FIG. 8. In order further to improve the seal between the leading surface 655 of the portion 650 and the first member 700, in an embodiment a cavity is formed (e.g. drilled, laser milled or electrical discharge machining (EDM)) to include a portion of the gap between the leading surface 655 of the portion 650 and the surface 755 defining the recess 710. The cavity 750 is illustrated in FIG. 9 and in FIG. 12. Thus, the surfaces of the cavity 750 are partly defined by the portion 650 and partly by the first member 700 (they define the sides of the cavity).

A third member 800 is positioned in the cavity 750 as illustrated in FIG. 10 thereby to form a seal between the first chamber 400 and the second chamber 401. The cavity 750 extends into the first member 700 below the level of the first chamber 400 and the second chamber 401. Because the first member 700 and the second member 600 may be bolted or welded together before the cavity 750 is formed, it is easier to form the cavity 750 to have a tight tolerance with the third member 800 than to form the first member 700 and the second member 600. Therefore and even better seal can be achieved between the third member 800 and the first member 700 and between the third member 800 and the portion 650 in the embodiment of FIGS. 10 and 12.

Figure 13:
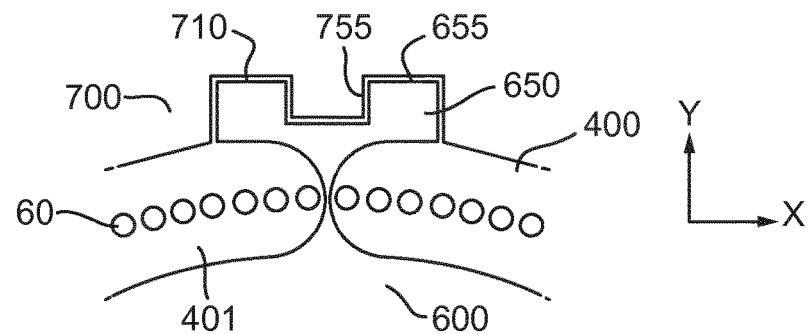
FIG. 13 is a cross-sectional view of a detail of the separation between a first chamber and a second chamber of a liquid confinement structure.

FIG. 13 illustrates another embodiment which is an improvement of the embodiment illustrated in FIG. 8 in terms of sealing performance and an improvement over the FIG. 10/12 embodiment in terms of manufacturability, though not sealing performance. In the embodiment of FIG. 13 the leading surface 655 of the portion 650 is shaped to have a tortuous path with a plurality of corners or surface changes in direction. The surface 755 of the recess 710 has a complementary shape to the leading surface 655 such that the leading surface 655 and surface of the recess 755 together form a labyrinth seal. The labyrinth seal has a longer length than the seal formed in the embodiment of FIG. 8, thereby improving fluid tightness between the first chamber 400 and second chamber 401.

In an embodiment, there is provided an immersion lithography apparatus comprising: a support table configured to support an object having at least one target portion; a projection system configured to project a patterned beam onto the object; a positioner configured to move the support table relative to the projection system; a liquid confinement structure configured to confine a liquid to an immersion space between the projection system and a surface of the object and/or the support table using a fluid flow into and/or out of the liquid confinement structure through a series of openings formed in the liquid confinement structure; and a controller configured to control the positioner to move the support table to follow a route comprised of a series of motions and to control the liquid confinement structure wherein each motion involves the support table moving relative to the liquid confinement structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure, the controller adapted to: predict whether the liquid will be lost from the immersion space during at least one motion of the series of motions in which an edge of the immersion space passes over an edge of the object, and if liquid loss from the immersion space is predicted, to modify the fluid flow such that a first fluid flow rate into or out of an opening of the series of openings at the leading edge of the liquid confinement structure is different to a second fluid flow rate into or out of an opening of the series of openings at the trailing edge of the liquid confinement structure during the motion of predicted liquid loss or a motion of the series of motions subsequent to the motion of predicted liquid loss.

In an embodiment, the controller is adapted, if liquid loss from the immersion space is predicted, to modify the fluid flow by increasing the second fluid flow rate out of the openings of the series of openings at the trailing edge during the motion of predicted liquid loss. In an embodiment, the series of openings are for forming a gas knife around the immersion space and/or wherein the liquid confinement structure further comprises a further series of further openings radially inward with respect to an optical axis of the projection system of the series of openings, and wherein the controller is adapted to modify the fluid flow such that a third fluid flow rate into or out of a further opening of the further series of further openings at the leading edge is different to a fourth fluid flow rate into or out of a further opening of the further series of further openings at the trailing edge. In an embodiment, the controller is adapted, if liquid loss from the immersion space is predicted, to modify the fluid flow by increasing the fourth fluid flow rate out of the further opening of the further series of further openings at the trailing edge during the motion of predicted liquid loss. In an embodiment, a velocity of gas in the second fluid flow rate is substantially equal to a velocity of gas in the fourth fluid flow rate. In an embodiment, the controller is configured to forecast the presence of liquid lost in the at least one motion in the path of the immersion space in a subsequent motion to the at least one motion. In an embodiment, the controller is adapted to modify the fluid flow during the subsequent motion in which lost liquid is forecast to be present in the path of the immersion space. In an embodiment, the controller is adapted to modify the flow by decreasing the fluid flow rate out of an opening of the series of openings at the leading edge if it is determined that a quantity of the lost liquid in the path of the immersion space during the subsequent motion is less than a predetermined maximum quantity or the controller is adapted to modify the fluid flow by increasing the fluid flow rate out of an opening of the series of openings at the leading edge if it is determined by the controller that a quantity of the lost liquid in the path of the immersion space during the subsequent motion is greater than a predetermined minimum quantity, and/or the controller is adapted to modify the fluid flow by increasing the fluid flow rate out of an opening of the series of openings at the leading edge if it is forecast by the controller that during the subsequent motion the increased gas flow would be effective to push the lost liquid in the path of the immersion space to a predetermined position. In an embodiment, the predetermined position is off the object. In an embodiment, the object is a substrate or a sensor. In an embodiment, in order to predict whether liquid will be lost, the controller is adapted to predict a speed of the edge of the immersion space relative to the edge of the object when the edge of the immersion space passes over the edge of the object during at least one motion of the series of motions of the route; and compare the speed to a predetermined parameter and to predict liquid loss from the immersion space during the at least one motion if the speed is greater than the predetermined parameter. In an embodiment, the controller is configured such that the predicting the speed comprises determining the speed of the velocity of the edge of the immersion space in a direction normal to the edge of the object during the at least one motion.

In an embodiment, there is provided a device manufacturing method using an immersion lithography apparatus to project a patterned beam onto a substrate having a plurality of target portions, the method comprising: confining a liquid to an immersion space between a projection system and a facing surface of an object on a support table and/or the support table using a fluid flow into and/or out of the liquid confinement structure through a series of openings in the liquid confinement structure; moving the support table along a route comprising a series of motions, wherein each motion involves the support table moving relative to the liquid confinement structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure; predicting whether liquid will be lost from the immersion space during at least one motion of the series of motions in which an edge of the immersion space passes over an edge of the object, and if liquid loss from the immersion space is predicted, modifying the fluid flow such that a first fluid flow rate into or out of an opening of the series of openings at the leading edge of the liquid confinement structure is different to a second fluid flow rate into or out of an opening of the series of openings at the trailing edge of the liquid confinement structure during the motion of predicted liquid loss or a motion of the series of motions subsequent to the motion of predicted liquid loss.

In an embodiment, there is provided a fluid handling structure for a lithographic apparatus, the fluid handling structure having a series of openings, the fluid handling structure for provision of fluid and/or liquid therethrough, the fluid handing structure configured such that the openings are directed, in use, towards a substrate and/or substrate table configured to support the substrate, wherein a first subset of the series of openings is in fluid communication with a first chamber and a second subset of the series of openings is in fluid communication with a second chamber, the first chamber and second chamber being defined between a first member in which the series of openings are defined and a second member, a portion of one the first member and the second member extending from a first side of the series of openings between two adjacent openings of the series of openings and into a recess in the other of the first member and the second member on a second side of the series of openings opposite to the first side, one of the two adjacent openings being in the first subset and the other of the two adjacent openings being in the second subset and the portion separating the first chamber from the second chamber. In an embodiment, a first part of the portion which is between the two adjacent openings is thinner than a second part of the first portion which is in the recess, and/or wherein a cavity is formed in the fluid handling structure with sides thereof defined partly in the portion and partly in the other member, a third member being positioned in the cavity thereby to form a seal between the first chamber and second chamber, and/or wherein a leading edge of the portion and the recess have complementary surfaces constructed together to form a labyrinth seal.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure having a series of openings, the fluid handling structure for provision of fluid and/or liquid therethrough, the fluid handling structure configured such that the openings are directed, in use, towards a substrate and/or substrate table configured to support the substrate, wherein a first subset of the series of openings is in fluid communication with a first chamber and a second subset of the series of openings is in fluid communication with a second chamber, the first chamber and second chamber being defined between a first member in which the series of openings are defined and a second member, a portion of the first member or second member extending from a first side of the series of openings between two adjacent openings of the series of openings and into a recess in the other of the first member or second member on a second side of the series of openings opposite to the first side, one of the two adjacent openings being in the first subset and the other of the two adjacent openings being in the second subset and the portion separating the first chamber from the second chamber.

2. The fluid handling structure of claim 1, wherein a first part of the portion which is between the two adjacent openings is thinner than a second part of the first portion which is in the recess, and/or wherein a cavity is formed in the fluid handling structure with sides thereof defined partly in the portion and partly in the other member, a third member being positioned in the cavity thereby to form a seal between the first chamber and second chamber, and/or wherein a leading edge of the portion and the recess have complementary surfaces constructed together to form a labyrinth seal.

3. The fluid handling structure of claim 1, wherein a cavity is formed in the fluid handling structure with sides thereof defined partly in the portion and partly in the other member, a third member being positioned in the cavity thereby to form a seal between the first chamber and second chamber.

4. The fluid handling structure of claim 1, wherein a leading edge of the portion and the recess have complementary surfaces constructed together to form a labyrinth seal.

5. A lithography apparatus comprising:
   a support table configured to support an object;
   a projection system configured to project a beam of radiation to expose the object; and
   the fluid handling structure of claim 1.

6. The lithography apparatus of claim 5, further comprising a controller configured to control movement of the support table to follow a route comprised of a series of motions and to control the liquid confinement structure wherein each motion involves the support table moving relative to the fluid handling structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure, the controller configured to modify fluid flow such that a first fluid flow rate into or out of at least one of the openings connected to the first chamber at the leading edge of the liquid confinement structure is different to a second fluid flow rate into or out of at least one of the openings connected to the second chamber at the trailing edge of the liquid confinement structure during a motion of the series of motions.

7. A fluid handling structure for a lithographic apparatus, the fluid handling structure having a first chamber, a second chamber, an extractor comprising a first series of openings formed in the fluid handling structure, a gas supply system comprising a second series of openings formed in the fluid handling structure and located outward, relative to a center of the fluid handling structure, of the first series of openings of the extractor, and at least one further opening configured to provide gas between the extractor and the gas supply system, the first series of openings, the second series of openings and the at least one further opening directed, in use, towards a substrate and/or a support table configured to support the substrate, wherein a first subset of openings of the first and second series of openings and an opening of the at least one further opening is in first fluid communication with the first chamber of the first and second chambers and a second subset of openings of the first and second series of openings and an opening of the at least one further opening is in first fluid communication with the second chamber of the first and second chambers.

8. The fluid handling structure of claim 7, comprising a first member and a second member which are brought together so as to define the first chamber and the second chamber therebetween.

9. The fluid handling structure of claim 8, wherein the second member comprises a portion extending from one side of the second series of openings between two adjacent openings of the second series of openings to the other side of the second series of openings.

10. The fluid handling structure of claim 9, wherein a recess is formed in the first member on a second side of the second series of openings opposite to a first side from which the portion projects from the second chamber such that the portion extends into the recess.

11. The fluid handling structure of claim 10, wherein a first part of the portion which is between the two adjacent openings of the second series of openings is thinner than a second part of the portion which is in the recess.

12. The fluid handling structure of claim 9, wherein a cavity is formed with sides thereof defined partly in the portion and partly in the first member.

13. The fluid handling structure of claim 12, further comprising a third member positioned in the cavity so to form a seal between the first chamber and second chamber.

14. A lithography apparatus comprising:
a support table configured to support an object;
a projection system configured to project a beam of radiation to expose the object; and
the fluid handling structure of claim 7.

15. The lithography apparatus of claim 14, further comprising a controller configured to control movement of the support table to follow a route comprised of a series of motions and to control the liquid confinement structure wherein each motion involves the support table moving relative to the fluid handling structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure, the controller configured to modify fluid flow such that a first fluid flow rate into or out of at least one of the openings connected to the first chamber at the leading edge of the liquid confinement structure is different to a second fluid flow rate into or out of at least one of the openings connected to the second chamber at the trailing edge of the liquid confinement structure during a motion of the series of motions.

16. A fluid handling structure for a lithographic apparatus, the fluid handling structure comprising:
a first chamber;
a second chamber;
an extractor comprising a first series of openings configured to extract fluid from an immersion space;
a gas supply system comprising a second series of openings configured to supply gas to the immersion space, each opening of the second series of openings located further from a central portion of the fluid handling structure than an adjacent opening of the first series of openings of the extractor; and
at least one further opening configured to provide gas, the at least one further opening located between the first and second series of openings,
wherein the first series of openings, the second series of openings and the at least one further opening are directed, in use, towards a substrate and/or a support table configured to support the substrate,
wherein a first subset of openings of the second series of openings and an opening of the at least one further opening is in first fluid communication with the first chamber of the first and second chambers and a second subset of openings of the second series of openings and an opening of the at least one further opening is in first fluid communication with the second chamber of the first and second chambers.

17. The fluid handling structure of claim 16, comprising a first member and a second member which are brought together so as to define the first chamber and the second chamber therebetween.

18. The fluid handling structure of claim 17, wherein the second member comprises a portion extending from one side of the second series of openings between two adjacent openings of the second series of openings to the other side of the second series of openings.

19. The fluid handling structure of claim 18, wherein a recess is formed in the first member on a second side of the second series of openings opposite to a first side from which the portion projects from the second chamber such that the portion extends into the recess.

20. A lithography apparatus comprising:
a support table configured to support an object;
a projection system configured to project a beam of radiation to expose the object; and
the fluid handling structure of claim 16.

21. The lithography apparatus of claim 20, further comprising a controller configured to control movement of the support table to follow a route comprised of a series of motions and to control the liquid confinement structure wherein each motion involves the support table moving relative to the fluid handling structure such that a portion of the support table which moves from being not under the liquid confinement structure to being under the liquid confinement structure passes under a leading edge of the liquid confinement structure and a portion of the support table which moves from being under the liquid confinement structure to being not under the liquid confinement structure passes under a trailing edge of the liquid confinement structure, the controller configured to modify fluid flow such that a first fluid flow rate into or out of at least one of the openings connected to the first chamber at the leading edge of the liquid confinement structure is different to a second fluid flow rate into or out of at least one of the openings connected to the second chamber at the trailing edge of the liquid confinement structure during a motion of the series of motions.

* * * * *